(12) United States Patent
McCollum

(10) Patent No.: US 8,320,178 B2
(45) Date of Patent: Nov. 27, 2012

(54) PUSH-PULL PROGRAMMABLE LOGIC DEVICE CELL

(75) Inventor: John McCollum, Saratoga, CA (US)

(73) Assignee: Actel Corporation, Mountain View, CA (US)

( * ) Notice: Subject to any disclaimer, the term of this patent is extended or adjusted under 35 U.S.C. 154(b) by 175 days.

(21) Appl. No.: 12/828,606

(22) Filed: Jul. 1, 2010

(65) Prior Publication Data

US 2011/0002167 A1   Jan. 6, 2011

Related U.S. Application Data

(60) Provisional application No. 61/222,708, filed on Jul. 2, 2009.

(51) Int. Cl.
*G11C 16/04* (2006.01)

(52) U.S. Cl. .................. 365/185.07; 365/185.01

(58) Field of Classification Search .............. None
See application file for complete search history.

(56) References Cited

U.S. PATENT DOCUMENTS

| | | | |
|---|---|---|---|
| 4,758,745 A | 7/1988 | Elgamal et al. |
| 4,873,459 A | 10/1989 | El Gamal et al. |
| 4,904,338 A | 2/1990 | Kozicki |
| 5,229,963 A | 7/1993 | Ohtsuka et al. |
| 5,314,772 A | 5/1994 | Kozicki et al. |
| 5,463,583 A | 10/1995 | Takashina |
| 5,500,532 A | 3/1996 | Kozicki |
| 5,537,056 A | 7/1996 | McCollum |
| 5,542,690 A | 8/1996 | Kozicki |
| 5,557,137 A | 9/1996 | Cohen |
| 5,576,568 A | 11/1996 | Kowshik |
| 5,587,603 A | 12/1996 | Kowshik |
| 5,625,211 A | 4/1997 | Kowshik |
| 5,682,389 A | 10/1997 | Nizaka |
| 5,729,162 A | 3/1998 | Rouy |
| 5,761,115 A | 6/1998 | Kozicki et al. |
| 5,812,452 A | 9/1998 | Hoang |
| 5,896,312 A | 4/1999 | Kozicki et al. |
| 5,914,893 A | 6/1999 | Kozicki et al. |
| 6,084,796 A | 7/2000 | Kozicki et al. |
| 6,100,560 A | 8/2000 | Lovett |
| 6,137,725 A | 10/2000 | Caser et al. |

(Continued)

OTHER PUBLICATIONS

Lemieux, G. et al., "Directional and Single-Driver Wires in FPGA Interconnect," International Conference on Field-Programmable Technology (ICFPT), Dec. 2004, pp. 41-48, Brisbane, Australia.

(Continued)

*Primary Examiner* — Hoai V Ho
*Assistant Examiner* — James G Norman
(74) *Attorney, Agent, or Firm* — Lewis and Roca LLP

(57) ABSTRACT

A memory cell includes a non-volatile p-channel transistor having a source coupled to a first potential, a drain, and a gate. A non-volatile n-channel transistor has a source coupled to a second potential, a drain, and a gate. A switch transistor has a gate coupled to a switch node, a source, and a drain. A stress transistor has a source and drain coupled between the drain of the non-volatile p-channel transistor and the drain of the non-volatile n-channel transistor, the stress transistor having a gate coupled to a gate bias circuit. Where one of the first or second potentials is a bit line, an isolation transistor is coupled between the other of the second potentials and one of the non-volatile transistors.

17 Claims, 6 Drawing Sheets

U.S. PATENT DOCUMENTS

| | | | |
|---|---|---|---|
| 6,144,580 A | 11/2000 | Murray | |
| 6,222,774 B1 | 4/2001 | Tanzawa et al. | |
| 6,324,102 B1 | 11/2001 | McCollum | |
| 6,348,365 B1 | 2/2002 | Moore et al. | |
| 6,356,478 B1 | 3/2002 | McCollum | |
| 6,388,324 B2 | 5/2002 | Kozicki | |
| 6,418,049 B1 | 7/2002 | Kozicki et al. | |
| 6,437,365 B1 | 8/2002 | Hawley et al. | |
| 6,469,364 B1 | 10/2002 | Kozicki | |
| 6,487,106 B1 | 11/2002 | Kozicki | |
| 6,635,914 B2 | 10/2003 | Kozicki et al. | |
| 6,709,887 B2 | 3/2004 | Moore et al. | |
| 6,768,678 B1* | 7/2004 | Hsu et al. | 365/185.21 |
| 6,798,692 B2 | 9/2004 | Kozicki et al. | |
| 6,825,489 B2 | 11/2004 | Kozicki | |
| 6,864,500 B2 | 3/2005 | Gilton | |
| 6,865,117 B2 | 3/2005 | Kozicki | |
| 6,891,769 B2 | 5/2005 | McCollum et al. | |
| 6,914,802 B2 | 7/2005 | Kozicki | |
| 6,927,411 B2 | 8/2005 | Kozicki | |
| 6,940,745 B2 | 9/2005 | Kozicki | |
| 6,955,940 B2 | 10/2005 | Campbell et al. | |
| 6,970,383 B1 | 11/2005 | Han | |
| 6,985,378 B2 | 1/2006 | Kozicki | |
| 6,998,312 B2 | 2/2006 | Kozicki et al. | |
| 7,006,376 B2 | 2/2006 | Kozicki | |
| 7,101,728 B2 | 9/2006 | Kozicki et al. | |
| 7,120,053 B2 | 10/2006 | Atsumi et al. | |
| 7,120,079 B2 | 10/2006 | McCollum et al. | |
| 7,142,450 B2 | 11/2006 | Kozicki et al. | |
| 7,145,794 B2 | 12/2006 | Kozicki | |
| 7,169,635 B2 | 1/2007 | Kozicki | |
| 7,180,104 B2 | 2/2007 | Kozicki | |
| 7,187,610 B1 | 3/2007 | McCollum et al. | |
| 7,227,169 B2 | 6/2007 | Kozicki | |
| 7,245,535 B2 | 7/2007 | McCollum et al. | |
| 7,288,781 B2 | 10/2007 | Kozicki | |
| 7,294,875 B2 | 11/2007 | Kozicki | |
| 7,301,821 B1 | 11/2007 | Greene et al. | |
| 7,368,789 B1 | 5/2008 | Dhaoui et al. | |
| 7,372,065 B2 | 5/2008 | Kozicki et al. | |
| 7,385,219 B2 | 6/2008 | Kozicki et al. | |
| 7,402,847 B2 | 7/2008 | Kozicki et al. | |
| 7,405,967 B2 | 7/2008 | Kozicki et al. | |
| 7,430,137 B2 | 9/2008 | Greene et al. | |
| 7,499,360 B2 | 3/2009 | McCollum et al. | |
| 7,511,532 B2 | 3/2009 | Derharcobian et al. | |
| 7,519,000 B2 | 4/2009 | Caveney et al. | |
| 7,560,722 B2 | 7/2009 | Kozicki | |
| 7,675,766 B2 | 3/2010 | Kozicki | |
| 7,692,972 B1 | 4/2010 | Wang et al. | |
| 7,728,322 B2 | 6/2010 | Kozicki | |
| 7,763,158 B2 | 7/2010 | Kozicki | |
| 7,839,681 B2 | 11/2010 | Wang et al. | |
| 2003/0107105 A1 | 6/2003 | Kozicki | |
| 2004/0124407 A1 | 7/2004 | Kozicki et al. | |
| 2005/0141431 A1 | 6/2005 | Caveney et al. | |
| 2005/0225413 A1 | 10/2005 | Kozicki et al. | |
| 2006/0086989 A1 | 4/2006 | Lee | |
| 2006/0238185 A1 | 10/2006 | Kozicki | |
| 2006/0291364 A1 | 12/2006 | Kozicki | |
| 2007/0165446 A1 | 7/2007 | Oliva et al. | |
| 2007/0165532 A1 | 7/2007 | Retana et al. | |
| 2008/0101117 A1* | 5/2008 | Ogura et al. | 365/185.05 |
| 2008/0113560 A1 | 5/2008 | Caveney et al. | |
| 2008/0211540 A1 | 9/2008 | Fujita | |
| 2008/0279028 A1 | 11/2008 | McCollum et al. | |
| 2009/0198812 A1 | 8/2009 | Caveney et al. | |
| 2009/0283740 A1 | 11/2009 | Kozicki et al. | |
| 2010/0092656 A1 | 4/2010 | Kozicki | |
| 2010/0135071 A1 | 6/2010 | Kozicki | |
| 2010/0149873 A1 | 6/2010 | Wang | |
| 2010/0157688 A1 | 6/2010 | Issaq | |
| 2010/0208520 A1 | 8/2010 | Wang et al. | |
| 2011/0001108 A1 | 1/2011 | Greene et al. | |
| 2011/0001115 A1 | 1/2011 | Greene et al. | |
| 2011/0001116 A1 | 1/2011 | Greene et al. | |
| 2011/0002167 A1 | 1/2011 | McCollum | |
| 2011/0024821 A1 | 2/2011 | Wang | |

OTHER PUBLICATIONS

Aratani, K. "A Novel Resistance Memory with High Scalability and Nanosecond Switching," IEDM, 2007, pp. 783-786.

Baek, I. G. et al., "Highly Scalable Non-volatile Resistive Memory using Simple Binary Oxide Driven by Asymmetric Uni-polar Voltage Pulses, Samsung Advanced Institute of Technology," IDEM 2004, 26 pages.

Burr, G. W. et al., "Overview of Candidate Device Technologies for Storage-class Memory," IBM Journal of Research & Development, 2008, vol. 52, No. 4/5, pp. 449-464.

Choi, S. J. et al., "Improvement of CBRAM Resistance Window by Scaling Down Electrode Size in Pure-GeTe Film," IEEE Electron Device Letters, Feb. 2009, vol. 30, No. 2, pp. 120-122.

Fang, T. N. et al, "Erase Mechanism for Copper Oxide Resistive Switching Memory Cells with Nickel Electrode," Int'l Electron Devices Meeting, 2006, pp. 1-4.

Greene, Jonathan et al., "Antifuse Field Programmable Gate Arrays," Proceedings of the IEEE, Jul. 1993, vol. 81, No. 7, pp. 1042-1056.

Kund, Michael et al., "Conductive Bridging RAM (CBRAM): An Emerging Non-volatile Memory Technology Scalable to Sub 20nm," IEDM Technical Digest, Dec. 5, 2005, pp. 754-757, held in Washington, D.C.

Meyer, R., "Scalable Non-volatile Cross-point Memory Based on Dual-layer Oxide Memory Elements," 9th Annual Non-volatile Memory Technology Symposium, Nov. 11-14, 2008, in Pacific Grove, CA, Unity Semiconductor Corporation, Sunnyvale, CA 94085, 41 pages.

Meyer, R. et al., "Oxide Dual-layer Memory Element for Scalable Non-volatile Cross-point Memory Technology," 9th Annual Non-volatile Memory Technology Symposium, Nov. 11-14, 2008, in Pacific Grove, CA, pp. 1-5.

Sakamoto, T. et al., "A /Ta2O5 Solid-Electrolyte Switch with Improved Reliabiltiy," 2007 IEEE Symposium on VLSI Technogy, Jun. 12-14, 2007, pp. 38-39, held in Kyoto, JP.

Strukov, Dimitri B. et al., "The Missing Memristor Found," Nature, May 1 2008, vol. 453, pp. 80-85.

Symanczyk, Ralf, "Conductive Bridging Memory Devleopment from Single Cells to 2Mbit Memory Arrays," 8th Non-Volatile Memory Technology Symposium, Nov. 10-13, 2007, 25 pages.

U.S. Appl. No. 11/851,324, filed Sep. 6, 2007 entitled "Programmable Memory Cell and Array for Programmable Logic Including Trench Isolation," and abandoned Jun. 19, 2009.

Office Action mailed Jun. 9, 2010 in copending U.S. Appl. No. 12/343,308, filed Dec. 23, 2003 entitled "Push-Pull Memory Cell Configured for Simultaneous Programming on N-Channel and P-Channel Non-Volatile Transistors."

Notice of Allowance mailed Nov. 26, 2010 in copending U.S. Appl. No. 12/343,308, filed Dec. 23, 2003 entitled "Push-Pull Memory Cell Configured for Simultaneous Programming on N-Channel and P-Channel Non-Volatile Transistors."

Copending U.S. Appl. No. 12/903,493 entitled "Push-Pull FPGA Cell" filed Oct. 13, 2010.

* cited by examiner

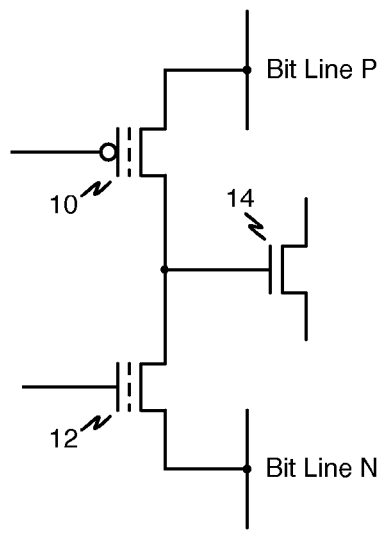
FIGURE 5A
(PRIOR ART)
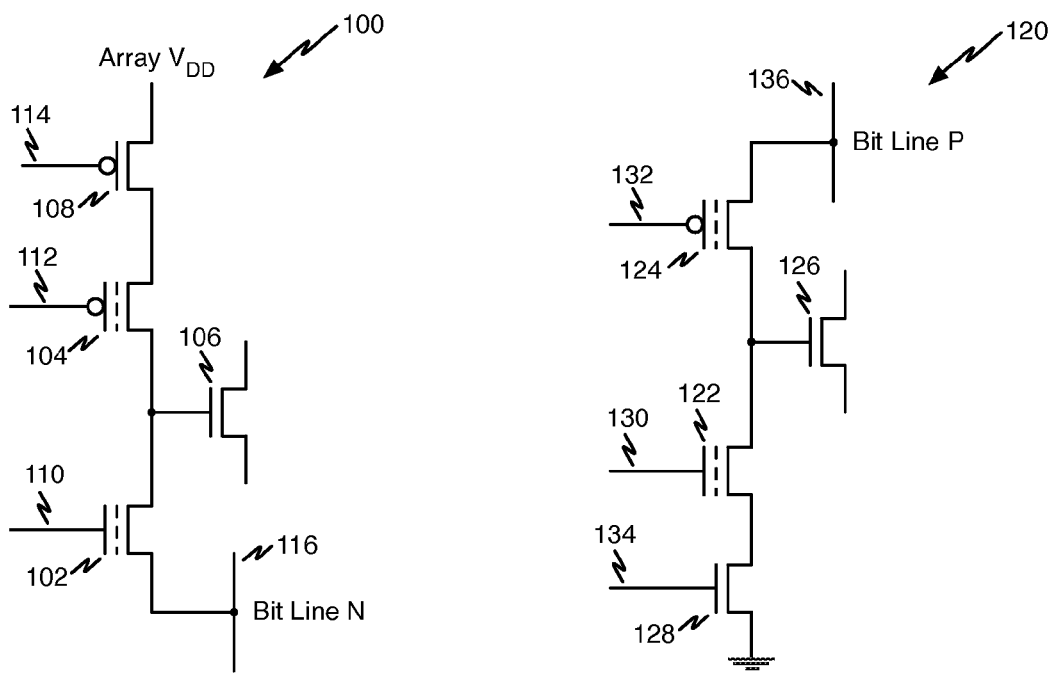
FIGURE 5B          FIGURE 5C

| Terminal | EraseN | Erase P | Program N | Program P | Normal Operation |
|---|---|---|---|---|---|
| Source of 24 | 0 | 0 | -3.8 | 3.8 | 3.3 |
| Gate of 24 (32) | 0 | 10 | 0 | -6.2 | 3.3 |
| Gate of 28 (34) | 0 | 0 | 0 | 0 | 1.8 |
| Gate of 22 (30) | -10 | 0 | 6.2 | 0 | 0 |
| Source of 22 | 0 | 0 | -3.8 | 3.8 | 0 |

| Terminal | Erase N | Erase P | Program N | Program P | Normal Operation |
|---|---|---|---|---|---|
| Source of 44 | 0 | 0 | -3.8 | 3.8 | 3.3 |
| Gate of 44 (52) | 0 | 10 | 0 | -6.2 | 3.3 |
| Gate of 48 (54) | 0 | 0 | 0 | 0 | 1.5 |
| Gate of 42 (50) | -10 | 0 | 6.2 | 0 | 0 |
| Source of 42 | 0 | 0 | -3.8 | 3.8 | 0 |

| Terminal | Erase N | Erase P | Program N | Program P | Normal Operation |
|---|---|---|---|---|---|
| Source of 64 | 0 | 0 | -3.8 | 3.8 | 3.3 |
| Gate of 64 (74) | 0 | 10 | 0 | -6.2 | 3.3 |
| Gate of 70 (78) | 0 | 0 | 0 | 0 | 1.8 |
| Gate of 68 (76) | 0 | 0 | 0 | 0 | 1.5 |
| Gate of 62 (72) | -10 | 0 | 6.2 | 0 | 0 |
| Source of 62 | 0 | 0 | -3.8 | 3.8 | 0 |

| Terminal | Erase N | Erase P | Program N | Program P | Normal Operation |
|---|---|---|---|---|---|
| Source of 108 (142) | 0 | 0 | 0 | 0 | 2.5 |
| Gate of 108 (114) | 0 | 0 | 0 | 3.8 | 0 |
| Gate of 104 (112) | 0 | 10 | 0 | -6.2 | 2.5 |
| Gate of 28 (34) | 0 | 0 | 0 | 0 | 1.5 |
| Gate of 102 (110) | -10 | 0 | 6.2 | 3.8 | 0 |
| Source of 102 (116) | 0 | 0 | -3.8 | 3.8 | 0 |

| Terminal | Erase N | Erase P | Program N | Program P | Normal Operation |
|---|---|---|---|---|---|
| Source of 124 (136) | 0 | 0 | -3.8 | 3.8 | 2.5 |
| Gate of 124 (132) | 0 | 10 | -3.8 | -6.2 | 2.5 |
| Gate of 28 (34) | 0 | 0 | -5 | 0 | 1.5 |
| Gate of 122 (130) | -10 | 0 | 6.2 | 0 | 0 |
| Gate of 128 (134) | 0 | 0 | 0 | 0 | 1.5 |
| Source of 128 (152) | 0 | 0 | 0 | 0 | 0 |

FIGURE 7

PUSH-PULL PROGRAMMABLE LOGIC DEVICE CELL

CLAIM FOR PRIORITY

This application claims the benefit of U.S. Provisional Application Ser. No. 61/222,708, filed on Jul. 2, 2009, the entirety of which is incorporated by reference herein.

BACKGROUND

1. Field of the Invention

The present invention relates to non-volatile memory cells in push-pull configuration. More particularly, the present invention relates to non-volatile memory cells in push-pull configuration that may be employed in FPGA devices.

2. The Prior Art

Push-pull non-volatile memory cells for FPGAs have been previously proposed, as shown by illustrative examples in FIGS. 1 and 2. As shown in both FIGS. 1 and 2, a basic push-pull non-volatile memory cell for use in an FPGA device includes a non-volatile p-channel memory transistor 10 connected in series with a non-volatile n-channel memory transistor 12. The common drain connections of the non-volatile p-channel memory transistor 10 and the non-volatile n-channel memory transistor 12 are connected to the gate of a volatile n-channel switch transistor 14 that is used to selectively make connections between circuit nets in the FPGA depending on the state of the memory cell. The push-pull non-volatile memory cell shown in FIG. 1 employs separate floating gates for the non-volatile p-channel memory transistor 10 and the non-volatile n-channel memory transistor 12, as well a separate control gate lines for both devices. The push-pull non-volatile memory cell shown in FIG. 2 employs a common floating gate for both the non-volatile p-channel memory transistor 10 and the non-volatile n-channel memory transistor 12, and a common control gate line for both devices.

When non-volatile p-channel memory transistor 10 is turned off and non-volatile n-channel memory transistor 12 is turned on, there is a low voltage at the gate of volatile n-channel switch transistor 14, which remains turned off. Conversely, when non-volatile p-channel memory transistor 10 is turned on and non-volatile n-channel memory transistor 12 is turned off, there is a high voltage at the gate of volatile n-channel switch transistor 14, which is then turned on.

In order for volatile n-channel switch transistor 14 to pass a high logic signal of around 1.5V, the voltage on its gate must be in excess of 2.5 volts. When n-channel memory transistor 12 is turned off, its drain is at a voltage of between about 2.5V and 3.3V and its source is at 0V. When p-channel memory transistor 12 is turned off, its drain is at a voltage of between about 0V and about 0.5V and its source is at voltage such as 2.5V or 3.3V. Persons of ordinary skill in the art will observe that the one of non-volatile p-channel memory transistor 10 and non-volatile n-channel memory transistor 12 that is turned off in the push-pull memory cell must be designed to tolerate a $V_{ds}$ of more than 2.5V for a period greater than 20 years for the device to have an acceptable lifetime. For many non-volatile memory devices this can cause the off device to degrade over time.

Prior art patents disclose full push-pull non-volatile memory cells, however it is not believed that there is an actual product employing such a cell has not been reported.

There remains a need for a push-pull non-volatile memory cell in which the volatile n-channel switch transistor is able to pass a high logic signal of around 1.5V and in which the memory transistor that is turned off in the push-pull memory cell can tolerate a $V_{ds}$ of more than 2.5V over the lifetime of the device.

BRIEF DESCRIPTION

According to one aspect of the present invention, stress may be reduced in one or both of the non-volatile transistors in a push-pull memory cell by providing at least one stress transistor in the memory cell. In the illustrative embodiments disclosed herein, a stress transistor may be provided between either the non-volatile n-channel transistor and the switch transistor, the non-volatile p-channel transistor and the switch transistor, or between both the non-volatile n-channel transistor and the switch transistor and the non-volatile p-channel transistor and the switch transistor. In other illustrative embodiments, a stress transistor may be provided between either the non-volatile n-channel transistor and ground, or the non-volatile p-channel transistor and $V_{DD}$.

According to another aspect of the present invention, a memory cell includes complementary pair of non-volatile transistors. A switch transistor has a source, a drain, and a gate coupled to the switch node and to the drain of the non-volatile p-channel transistor. An isolation transistor has a source and drain coupled between one of the power supply potentials and the source of one of the non-volatile transistors. The power supply potential may function as a global line.

BRIEF DESCRIPTION OF THE DRAWING FIGURES

FIG. 5A is a schematic diagram of an exemplary prior art push-pull non-volatile memory cell. FIGS. 5B and 5C are schematic diagrams of illustrative push-pull non-volatile memory cells that show various aspects of the present invention as compared with the prior art.

FIG. 7 is a set of a set of four tables that provides illustrative voltages for the various nodes of the circuits shown in FIGS. 3A, 3B, 3C, 5B, 5C, 6A, and 6B.

DETAILED DESCRIPTION

Persons of ordinary skill in the art will realize that the following description of the present invention is illustrative only and not in any way limiting. Other embodiments of the invention will readily suggest themselves to such skilled persons.

The problem encountered in prior-art non-volatile push-pull memory cells can be alleviated by placing at least one additional transistor in the cell order to limit the $V_{ds}$ of the non-volatile p-channel transistor, the non-volatile n-channel transistor, or both to around 0.5V and still allow the output to the gate of the switch transistor to be either at least a full 2.5V or even higher to fully turn on the switch transistor or at ground to fully turn off the switch transistor. In some embodiments, stress is relieved to the non-volatile p-channel transistor, the non-volatile n-channel transistor, or both.

Figure 1:
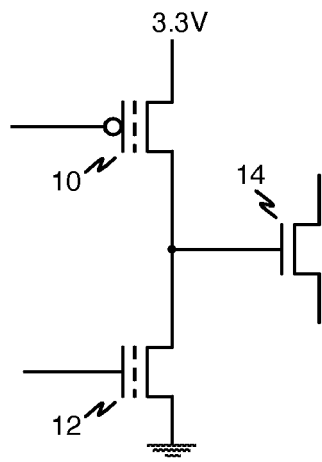
FIG. 1 is a schematic diagram of a first exemplary prior art push-pull non-volatile memory cell.
Figure 2:
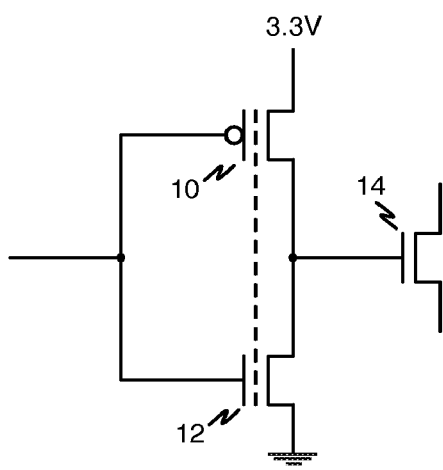
FIG. 2 is a schematic diagram of another exemplary prior art push-pull non-volatile memory cell.
Figure 3A:
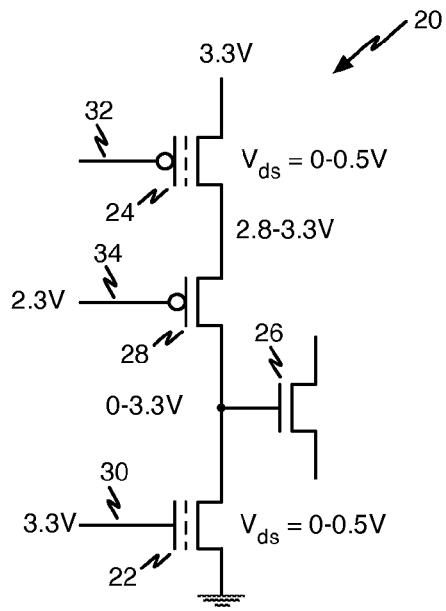
FIGS. 3A through 3C are schematic diagrams of illustrative push-pull non-volatile memory cells that show various aspects of the present invention.

Referring now to FIG. 3A, a schematic diagram shows an illustrative push-pull non-volatile memory cell 20 in order to show various aspects of the present invention. Memory cell 20 includes non-volatile n-channel transistor 22, non-volatile p-channel transistor 24, and volatile n-channel switch transistor 26. Non-volatile n-channel transistor 22 has its source coupled to ground and its drain coupled to the gate of volatile n-channel switch transistor 26. Non-volatile p-channel transistor 24 has its source coupled to the $V_{DD}$ supply (in this example assumed to be 3.3V) and its drain coupled to the source of a p-channel isolation transistor 28. The drain of p-channel isolation transistor 28 is coupled to the drain of non-volatile n-channel transistor 22 and the gate of volatile n-channel switch transistor 26.

The gate of non-volatile n-channel transistor 22 is coupled to a gate line 30. The gate of non-volatile p-channel transistor 24 is coupled to a gate line 32. The gate of p-channel isolation transistor 28 is coupled to a gate line 34.

Figure 3B:
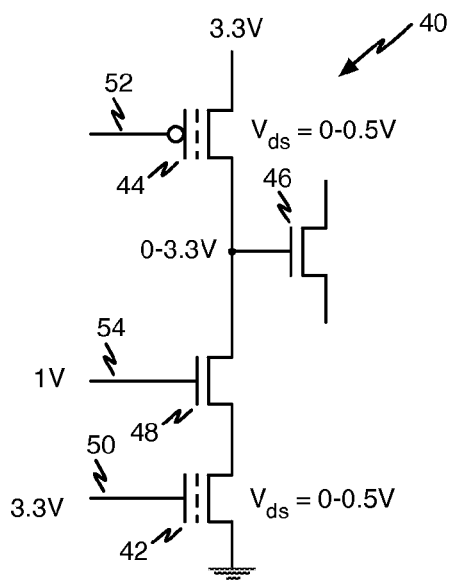

Referring now to FIG. 3B, a schematic diagram shows another illustrative push-pull non-volatile memory cell 40 in order to show various aspects of the present invention. Memory cell 40 includes non-volatile n-channel transistor 42, non-volatile p-channel transistor 44, and volatile n-channel switch transistor 46. Non-volatile p-channel transistor 44 has its source coupled to $V_{DD}$ and its drain coupled to the gate of volatile n-channel switch transistor 46. Non-volatile n-channel transistor 42 has its source coupled to ground and its drain coupled to the source of an n-channel isolation transistor 48. The drain of n-channel isolation transistor 48 is coupled to the drain of non-volatile p-channel transistor 44 and the gate of volatile n-channel switch transistor 46.

The gate of non-volatile n-channel transistor 42 is coupled to a gate line 50. The gate of non-volatile p-channel transistor 44 is coupled to a gate line 52. The gate of n-channel isolation transistor 48 is coupled to a gate line 54.

In the memory cell 20 of FIG. 3A, stress may be reduced on non-volatile p-channel transistor 24 when the memory cell is in the state where non-volatile p-channel memory transistor 24 is turned off, non-volatile n-channel memory transistor 22 is turned on, and volatile n-channel switch transistor 26 is turned off because its gate is at or near ground. By biasing gate line 34 of p-channel isolation transistor 28 at, for example, 2.3V, the drain of p-channel memory transistor 24 will be at a voltage of at least about 2.8V, and the $V_{ds}$ of p-channel memory transistor 24 will be at a voltage no higher than about 0.5V. In this case, because n-channel memory transistor 22 is turned on, its $V_{ds}$ will also be at a voltage no higher than about 0.5V.

In the memory cell 40 of FIG. 3B, stress may be reduced on non-volatile n-channel transistor 42 when the memory cell is in the state where non-volatile p-channel memory transistor 44 is turned on, non-volatile n-channel memory transistor 42 is turned off, and volatile n-channel switch transistor 46 is turned on because its gate is at or near $V_{DD}$. By biasing gate line 54 of n-channel isolation transistor 48 at, for example, 1V, the drain of n-channel memory transistor 42 will be at a voltage no greater than about 0.5V, and the $V_{ds}$ of n-channel memory transistor 42 will be at a voltage no higher than about 0.5V. In this case, because p-channel memory transistor 44 is turned on, its $V_{ds}$ will also be at a voltage no higher than about 0.5V.

Figure 3C:
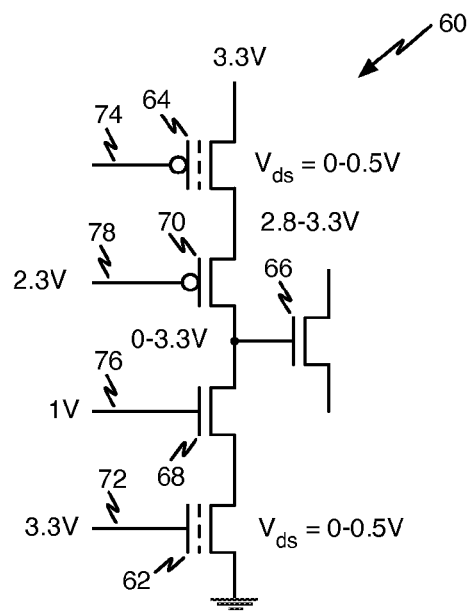

Referring now to FIG. 3C, a schematic diagram shows another illustrative push-pull non-volatile memory cell 60 in order to show other aspects of the present invention. Memory cell 60 includes non-volatile n-channel transistor 62, non-volatile p-channel transistor 64, and volatile n-channel switch transistor 66. Non-volatile p-channel transistor 64 has its source coupled to $V_{DD}$. Non-volatile n-channel transistor 62 has its source coupled to ground. The drain of non-volatile n-channel transistor 62 is coupled to the gate of volatile n-channel switch transistor 66 through n-channel isolation transistor 68. The drain of non-volatile p-channel transistor 64 is coupled to the gate of volatile n-channel switch transistor 66 through p-channel isolation transistor 70.

The gate of non-volatile n-channel transistor 62 is coupled to a gate line 72. The gate of non-volatile p-channel transistor 64 is coupled to a gate line 74. The gate of n-channel isolation transistor 68 is coupled to a gate line 76, and the gate of p-channel isolation transistor 70 is coupled to a gate line 78.

In the memory cell 60 of FIG. 3C, stress may be reduced on both non-volatile n-channel transistor 62 and non-volatile p-channel transistor 64. Stress may be reduced on non-volatile n-channel transistor 62 when the memory cell is in the state where non-volatile p-channel memory transistor 64 is turned on, non-volatile n-channel memory transistor 62 is turned off, and volatile n-channel switch transistor 66 is turned on because its gate is at or near $V_{DD}$. By biasing gate line 76 of n-channel isolation transistor 68 at, for example, 1V, and gate line 78 of p-channel isolation transistor 70 at, for example, 2.3V, the drain of n-channel memory transistor 62 will be at a voltage no greater than about 0.5V, and the $V_{ds}$ of n-channel memory transistor 62 will be at a voltage no higher than about 0.5V. In this case, because p-channel memory transistor 64 is turned on, its $V_{ds}$ will also be at a voltage no higher than about 0.5V.

Likewise, stress may be reduced on non-volatile p-channel transistor 64 when the memory cell is in the state where non-volatile p-channel memory transistor 64 is turned off, non-volatile n-channel memory transistor 62 is turned on, and volatile n-channel switch transistor 66 is turned off because its gate is at or near ground. In the above example where gate line 76 of n-channel isolation transistor 68 is biased at, for example, 1V, and gate line 78 of p-channel isolation transistor 70 is biased at, for example, 2.3V, the drain of p-channel memory transistor 64 will be at a voltage of at least about 2.8V, and the $V_{ds}$ of p-channel memory transistor 64 will be at a voltage no higher than about 0.5V. In this case, n-channel memory transistor 62 is turned on, and its $V_{ds}$ will also be at a voltage no higher than about 0.5V.

Figure 4A:
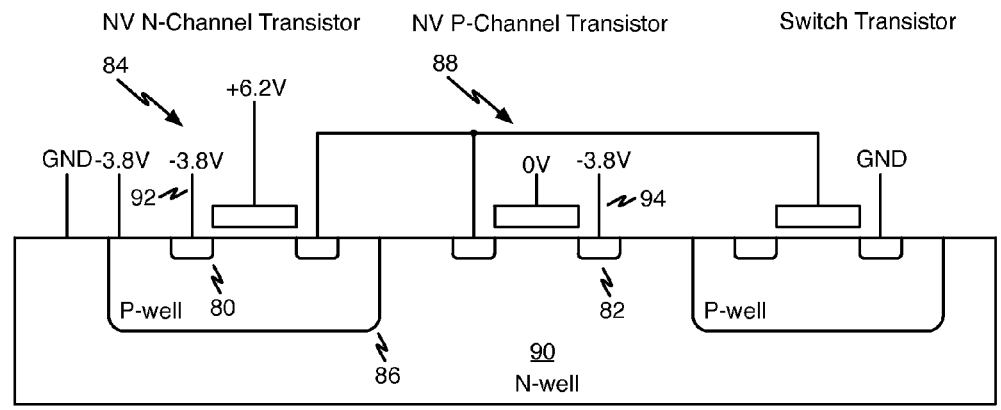
FIGS. 4A and 4B are cross sectional diagrams illustrating programming of push-pull memory cells.
Figure 4B:
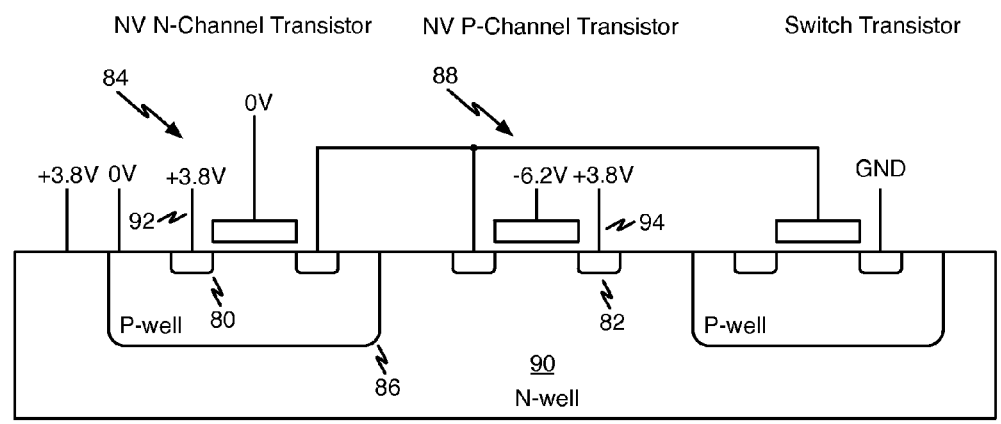

Referring now to FIGS. 4A and 4B, cross sectional diagrams illustrate typical potentials employed when programming non-volatile push-pull memory cells to turn off either the non-volatile p-channel transistor or the non-volatile n-channel transistor. Persons of ordinary skill in the art will observe that in either case, the sources of both the non-volatile p-channel transistor and the non-volatile n-channel transistor are at the same potential.

In FIG. 4A, the sources, 80 and 82, respectively, of both the non-volatile n-channel transistor 84 in the p-well 86 and the non-volatile p-channel transistor 88 in the n-well 90 are at −3.8V and in FIG. 4B, the sources 80 and 82, respectively, of both the non-volatile n-channel transistor and the non-volatile p-channel transistor are at +3.8V. In both FIGS. 4A and 4B it may also be seen that the non-volatile n-channel transistor 84 and the non-volatile p-channel transistor 88 each have a gate potential (−6.2V and 0V, respectively) that fully inverts both channels. Therefore both the non-volatile n-channel transistor 84 and the non-volatile p-channel transistor 88 are in the "on" state and therefore represent a DC path between the sources of both devices because both devices have previously been erased.

Under these conditions, it is clear that both the source bit line 92 of the non-volatile n-channel transistor 84 and the source bit line 94 of the non-volatile p-channel transistor 88 must be distinct from all other bit lines therefore requiring two bit lines for each column (as shown in prior-art FIG. 5A). Even though the one of the non-volatile p-channel transistor and the non-volatile n-channel transistor that is not being programmed can in fact be turned off, eliminating the connection between the two bit lines, this provides no advantage because the source 92 of the non-volatile n-channel transistor 84 needs to be decoded when it is being programmed and the source 94 of the non-volatile p-channel transistor 88 needs to be decoded when it is being programmed. Thus, two bit lines per cell are still required.

Since both the non-volatile n-channel transistor 84 and the non-volatile p-channel transistor 88 are turned on, only one bit line is required to program the memory cell. If the source of one of the non-volatile n-channel transistor 84 and the non-volatile p-channel transistor 88 could be isolated from the voltage supplying its source terminal, only one bit line would be needed. This can be accomplished by adding an isolation transistor as provided by another aspect of the present invention.

Referring now to FIGS. 5B and 5C, it may be seen that an isolation transistor may be added to isolate one of the non-volatile p-channel transistor and the non-volatile n-channel transistor from the bit line, allowing a global line to be used.

Referring now to FIG. 5B, memory cell 100 is shown to include non-volatile n-channel transistor 102, non-volatile p-channel transistor 104, and volatile n-channel switch transistor 106. Non-volatile p-channel transistor 104 has its source coupled to an array $V_{DD}$ line through a p-channel isolation transistor 108 and its drain coupled to the gate of volatile n-channel switch transistor 106. Non-volatile n-channel transistor 102 has its source coupled to bit line 116 and its drain coupled to the gate of volatile n-channel switch transistor 106.

The gate of non-volatile n-channel transistor 102 is coupled to a gate line 110. The gate of non-volatile p-channel transistor 104 is coupled to a gate line 112. The gate of p-channel isolation transistor 108 is coupled to a gate line 114.

In the memory cell 100, non-volatile p-channel transistor 104 is coupled through p-channel isolation transistor 108 so its source can be coupled to a common line $V_{DD}$. The addition of a single p-channel isolation transistor 108 allows making a trade off between metal complexity and the extra layout area required by the presence of a simple volatile p-channel transistor added to the cell.

Referring now to FIG. 5C, memory cell 120 is shown to include non-volatile n-channel transistor 122, non-volatile p-channel transistor 124, and volatile n-channel switch transistor 126. Non-volatile n-channel transistor 122 has its source coupled to ground through an n-channel isolation transistor 128 and its drain coupled to the gate of volatile n-channel switch transistor 126. Non-volatile p-channel transistor 124 has its source coupled to bit line 136 and its drain coupled to the gate of volatile n-channel switch transistor 126.

The gate of non-volatile n-channel transistor 122 is coupled to a gate line 130. The gate of non-volatile p-channel transistor 124 is coupled to a gate line 132. The gate of n-channel isolation transistor 128 is coupled to a gate line 134.

In the memory cell 120, non-volatile n-channel transistor 122 is coupled through n-channel isolation transistor 128 so its source can be a common line ground. The addition of a single n-channel isolation transistor 128 allows making a trade off between metal complexity and the extra layout area required by the presence of a simple volatile n-channel transistor isolation transistor 128 added to the cell.

As will be appreciated by persons of ordinary skill in the art, both the arrangements of FIGS. 5B and 5C both provide a single-bit-line solution. The programming channel voltage is merely passed from the bit line directly to the adjacent non-volatile memory transistor device or is passed to the complementary non-volatile memory transistor device through the on device.

Figures 6A, 6B:
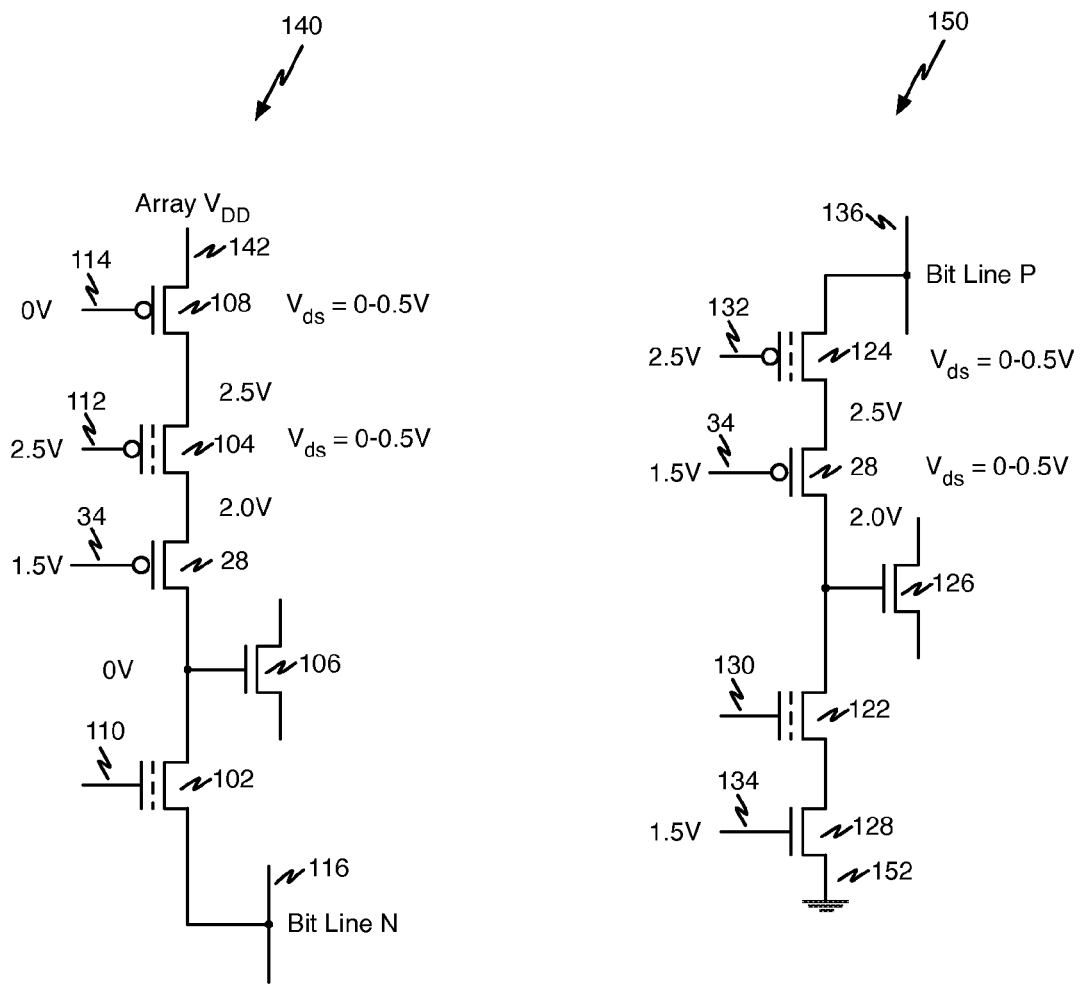
FIGS. 6A and 6B are schematic diagrams of illustrative push-pull non-volatile memory cells that show other various aspects of the present invention.

Referring now to FIGS. 6A and 6B, schematic diagrams of illustrative push-pull non-volatile memory cells show other various aspects of the present invention. Because FIGS. 6A and 6B include some of the same devices as shown in FIGS. 3A and 3B and FIGS. 5B and 5C, devices in FIGS. 6A and 6B corresponding to devices in FIGS. 3A and 3B and FIGS. 5B and 5C will be designated using the same reference numerals as used in FIGS. 3A and 3B and FIGS. 5B and 5C.

More specifically, FIGS. 6A and 6B illustrate an embodiment of the present invention in which one of the bit lines shown in FIG. 5A. In the cell shown in FIG. 5A, two bit lines are shown, one connected to the source of the non-volatile p-channel transistors and one connected to the sources of the non-volatile n-channel transistors in an array. Both of these bit lines must be decoded as the transistor channels will be on during programming, meaning that both bit lines must be at the same potential to avoid drawing DC power. Since approximately ½ the programming voltage comes from the bit lines, the bit lines must be decoded, resulting in larger memory cell width.

According to one aspect of the present invention, an isolation transistor and a stress-relieving transistor are both added to the transistor stack in the memory cell. The isolation transistor may be either a p-channel transistor at the source of the non-volatile p-channel transistor, or an n-channel isolation transistor at the source of the non-volatile n-channel transistor. This additional transistor can be turned off during programming. By configuring the memory cell in this manner, only one addressed bit line is necessary. The other bit line can be a global line saving significant area. The function of the stress-relieving transistor was disclosed with reference to FIGS. 3A through 3C.

Referring now to FIG. 6A, memory cell 140 is shown to include non-volatile n-channel transistor 102, non-volatile p-channel transistor 104, and volatile n-channel switch transistor 106. Non-volatile n-channel transistor 102 has its source coupled to bit line 116 and its drain coupled to the gate of volatile n-channel switch transistor 106. Non-volatile p-channel transistor 104 has its drain coupled to the drain of non-volatile n-channel transistor 102 through p-channel transistor 28. In this respect, the embodiment of FIG. 6A is similar to the embodiment shown in FIG. 3A.

In addition to the p-channel transistor 28, memory cell 140 of FIG. 6A includes a p-channel isolation transistor 108 connected between the source of non-volatile p-channel transistor 104 and the array $V_{DD}$ node 142. Non-volatile n-channel transistor 102 has its source coupled to bit line 116 and its drain coupled to the gate of volatile n-channel switch transistor 106.

The gate of non-volatile n-channel transistor 102 is coupled to a gate line 110. The gate of non-volatile p-channel transistor 104 is coupled to a gate line 112. The gate of p-channel isolation transistor 108 is coupled to a gate line 114. The gate of p-channel transistor 28 is coupled to a gate line 34.

In the memory cell 140, the source of non-volatile p-channel transistor 104 is coupled to array $V_{DD}$ node 142 through p-channel isolation transistor 108 so that its source can be coupled to a common $V_{DD}$ line. The addition of p-channel isolation transistor 108 allows making a trade off between metal complexity and the extra layout area required by the presence of a simple volatile p-channel transistor added to the cell. As in the embodiment of FIG. 3A, p-channel transistor 28 reduces stress on the non-volatile p-channel transistor 104 as previously described.

Referring now to FIG. 5C, memory cell 150 is shown to include non-volatile n-channel transistor 122, non-volatile p-channel transistor 124, and volatile n-channel switch transistor 126. Non-volatile n-channel transistor 122 has its source coupled to ground through an n-channel isolation transistor 128 and its drain coupled to the gate of volatile n-channel switch transistor 126. Non-volatile p-channel transistor 124 has its source coupled to bit line 136 and its drain coupled to the drain of non-volatile n-channel transistor 122 and the gate of volatile n-channel switch transistor 126 through transistor 28.

The gate of non-volatile n-channel transistor 122 is coupled to a gate line 130. The gate of non-volatile p-channel transistor 124 is coupled to a gate line 132. The gate of n-channel isolation transistor 128 is coupled to a gate line 134. The gate of p-channel transistor 28 is coupled to a gate line 34.

In the memory cell 150, the source of non-volatile n-channel transistor 122 is coupled to ground 152 through n-channel isolation transistor 128 so that its bit line can be a line 136 at the source of non-volatile p-channel transistor 124. The addition of n-channel isolation transistor 128 allows making a trade off between metal complexity and the extra layout area required by the presence of a simple volatile n-channel transistor isolation transistor 128 added to the cell. As in the embodiment of FIG. 3A, p-channel transistor 28 reduces stress on the non-volatile p-channel transistor 104 as previously described.

Persons of ordinary skill in the art will readily recognize that an n-channel stress-reducing transistor like n-channel transistor 48 in FIG. 3B could be used in place of or in addition to p-channel transistor 28 in either of the circuits of FIGS. 6A and 6B. Such embodiments are intended to fall within the scope of the present invention.

Referring now to FIG. 7, a set of four tables that provides illustrative voltages for the various nodes of the circuits shown in FIGS. 3A, 3B, 3C, 5B, 5C, 6A, and 6B. The numbers appearing next to the transistor element names in the "Terminals" column of the tables correspond to the reference numerals in the figures to which the terminals pertain. Persons of ordinary skill in the art will appreciate that these voltage values are illustrative only, and that actual voltages that will be encountered in real implementations of these circuits will depend on various factors such as process and geometry.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A memory cell including:
   a non-volatile p-channel transistor having a source coupled to a first potential, a drain, and a gate;
   a non-volatile n-channel transistor having a source coupled to a second potential, a drain, and a gate; and
   a stress transistor having a source and drain directly connected between the drain of the non-volatile p-channel transistor and the drain of the non-volatile n-channel transistor, the stress transistor having a gate coupled to a gate bias circuit.

2. The memory cell of claim 1, further including a switch transistor having a gate coupled to a switch node, a source, and a drain.

3. The memory cell of claim 1 wherein:
   the stress transistor is an n-channel transistor having a source directly connected to the drain of the non-volatile n-channel transistor and a drain directly connected to the drain of the non-volatile p-channel transistor; and
   the memory cell further including an n-channel switch transistor having a gate coupled to the drain of the stress transistor and the drain of the non-volatile n-channel transistor, a source, and a drain; and
   the switch node is coupled to the drain of the non-volatile p-channel transistor.

4. The memory cell of claim 1 wherein:
   the stress transistor is a p-channel transistor having a source directly connected to the
   drain of the non-volatile p-channel transistor and a drain directly connected to the drain of the non-volatile n-channel; and
   the memory cell further including an n-channel switch transistor having a gate directly connected to the drain of the stress transistor and the drain of the non-volatile n-channel transistor, a source, and a drain; and
   the switch node is coupled to the drain of the non-volatile n-channel transistor.

5. The memory cell of claim 2 wherein the switch transistor is an n-channel transistor.

6. A memory cell including:
   a non-volatile p-channel transistor having a drain coupled to a switch node, a source, and a gate;
   a non-volatile n-channel transistor having a source coupled to a bit line, a drain coupled to the switch node, and a gate; and
   an isolation transistor having a source and drain coupled between a first potential and the drain of the non-volatile p-channel transistor, the isolation transistor having a gate.

7. The memory cell of claim 6, further including a switch transistor having a gate coupled to the switch node and to the drain of the non-volatile p-channel transistor, a source, and a drain.

8. The memory cell of claim 6 wherein the isolation transistor is a p-channel transistor having a source coupled to the first potential, a drain coupled to the source of the non-volatile p-channel transistor, and a gate.

9. The memory cell of claim 7 wherein the switch transistor is an n-channel transistor.

10. A memory cell including:
    a non-volatile p-channel transistor having a source coupled to a bit line, a drain coupled to a switch node, and a gate;
    a non-volatile n-channel transistor having a source, a drain coupled to the switch node, and a gate; and
    an isolation transistor having a source and drain coupled between a first potential and the source of the non-volatile n-channel transistor, the isolation transistor having a gate.

11. The memory cell of claim 10, further including a switch transistor having a source, a drain, and a gate coupled to the switch node and to the drain of the non-volatile p-channel transistor.

12. The memory cell of claim 10 wherein the isolation transistor is an n-channel transistor having a source coupled to the first potential, a drain coupled to the source of the non-volatile n-channel transistor, and a gate.

13. The memory cell of claim 11 wherein the switch transistor is an n-channel transistor.

14. A memory cell including:
- a non-volatile p-channel transistor having a source, a drain, and a gate;
- a non-volatile n-channel transistor having a source coupled to a bit line, a drain coupled to a switch node, and a gate;
- a p-channel isolation transistor having a source coupled to a first potential, a drain coupled to the source of the non-volatile p-channel transistor, and a gate; and
- a p-channel stress transistor having a source coupled to the drain of the non-volatile p-channel transistor, a drain coupled to the switch node, and a gate.

15. The memory cell of claim 14, further including a switch transistor having a source, a drain, and a gate coupled to the switch node.

16. A memory cell including:
- a non-volatile p-channel transistor having a source coupled to a bit line, a drain, and a gate;
- a non-volatile n-channel transistor having a source, a drain coupled to a switch node, and a gate;
- an n-channel isolation transistor having a source coupled to a first potential, a drain coupled to the source of the non-volatile n-channel transistor, and a gate; and
- a p-channel stress transistor having a source coupled to the drain of the non-volatile p-channel transistor, a drain coupled to the switch node, and a gate.

17. The memory cell of claim 16, further including a switch transistor having a source, a drain, and a gate coupled to the switch node.

* * * * *